US008912543B2

(12) United States Patent
Park et al.

(10) Patent No.: US 8,912,543 B2
(45) Date of Patent: Dec. 16, 2014

(54) DISPLAY DEVICE

(71) Applicants: Cheon-Deok Park, Yongin (KR); So-Ra Kwon, Yongin (KR)

(72) Inventors: Cheon-Deok Park, Yongin (KR); So-Ra Kwon, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/954,190

(22) Filed: Jul. 30, 2013

(65) Prior Publication Data
US 2014/0070188 A1 Mar. 13, 2014

(30) Foreign Application Priority Data

Sep. 10, 2012 (KR) .................. 10-2012-0100103

(51) Int. Cl.
*H01L 29/04* (2006.01)
*H01L 31/036* (2006.01)
*H01L 31/0376* (2006.01)
*H01L 31/20* (2006.01)
*H01L 27/12* (2006.01)
*H01L 27/32* (2006.01)
*H01L 51/52* (2006.01)

(52) U.S. Cl.
CPC ............ *H01L 51/52* (2013.01); *H01L 27/1255* (2013.01); *H01L 2251/568* (2013.01); *H01L 27/3265* (2013.01)
USPC ........ 257/59; 257/72; 257/296; 257/E29.117; 257/E29.273

(58) Field of Classification Search
USPC ....... 257/59, 72, 296, 300, E29.117, E29.273
See application file for complete search history.

(56) References Cited

U.S. PATENT DOCUMENTS

2013/0127013 A1* 5/2013 Park et al. .................... 257/532

FOREIGN PATENT DOCUMENTS

JP 10-268362 A 10/1998
KR 10-0336887 B1 5/2002

* cited by examiner

*Primary Examiner* — Hoai V Pham
(74) *Attorney, Agent, or Firm* — Lee & Morse, P.C.

(57) ABSTRACT

The display device includes a substrate and a capacitor positioned on the substrate, the capacitor including a first capacitor electrode having a mesh shape and a second capacitor electrode having a mesh shape and positioned on the first capacitor electrode with an insulation layer therebetween.

11 Claims, 6 Drawing Sheets

DISPLAY DEVICE

RELATED APPLICATIONS

This application claims priority under 35 U.S.C. §119 to and the benefit of Korean Patent Application No. 10-2012-0100103 filed in the Korean Intellectual Property Office on Sep. 10, 2012, the entire contents of which are incorporated herein by reference.

BACKGROUND

1. Field

The described technology relates generally to a display device. More particularly, the described technology relates generally to a display device including a capacitor.

2. Description of the Related Art

An organic light emitting diode (OLED) display has been recently spotlighted as a display device for displaying images. The OLED display has a self-emissive characteristic, and differs from a liquid crystal display (LCD) in that it does not require a separate light source and has a relatively small thickness and weight. Furthermore, the OLED display exhibits high quality characteristics, e.g., low power consumption, high luminance, and quick response time.

A conventional OLED display includes an organic light emitting element, a thin film transistor connected to the organic light emitting element, and a capacitor connected to a gate electrode of the thin film transistor. Here, the capacitor includes a first capacitor electrode and a second capacitor electrode facing each other with an insulation layer interposed between them.

The above information disclosed in this Background section is only for enhancement of understanding of the background of the described technology and therefore it may contain information that does not form the prior art that is already known in this country to a person of ordinary skill in the art.

SUMMARY

An exemplary embodiment provides a display device in which only a defective portion of a capacitor electrode may be repaired, instead of replacing or repairing the entire capacitor electrode.

The present invention provides a substrate, and a capacitor positioned on the substrate and including a first capacitor electrode of a mesh shape and a second capacitor electrode positioned on the first capacitor electrode via an insulation layer and having a mesh shape.

The first capacitor electrode may include a plurality of first expansions separated from each other, and a plurality of first connections connecting neighboring first expansions.

The second capacitor electrode may include a plurality of second expansions separated from each other and corresponding to a plurality of the first expansions, and a plurality of second connections connecting neighboring second expansions.

The display device may further include: a driving thin film transistor including a driving active layer connected to the first capacitor electrode, a driving gate electrode connected to the second capacitor electrode, and a driving source electrode and a driving drain electrode separated from each other via the driving gate electrode and respectively connected to the driving active layer; and an organic light emitting element connected to the driving drain electrode.

The first capacitor electrode may be formed with the same material as the driving active layer, and the second capacitor electrode may be formed with the same material as the driving gate electrode.

The display device may further include: a scan line extending in a first direction; a data line extending in a second direction crossing the first direction; a switching thin film transistor including a switching source electrode connected to the data line, a switching gate electrode connected to the scan line, a switching active layer positioned corresponding to the switching gate electrode and connected to the switching source electrode, and a switching drain electrode separated from the switching source electrode via the switching gate electrode and connected to the second capacitor electrode; and a driving power source line connected to the driving source electrode and the second capacitor electrode and extending in the second direction.

The display device may further include a first thin film transistor including a first gate electrode connected to the first capacitor electrode, and an organic light emitting element connected to the first thin film transistor.

The display device may further include: an initial power source line extending in a first direction; a first scan line separated from the initial power source line and extending in the first direction; a second capacitor electrode separated from the first scan line and extending in the first direction; a second scan line separated from the second capacitor electrode and extending in the first direction; a light emission control line separated from the second scan line and extending in the first direction; a data line extending the second direction crossing the first direction; and a driving power source line separated from the data line, extending in the second direction, and connected to the second capacitor electrode.

The first scan line and the second scan line may be positioned with different layers via the insulation layer on the substrate, and the first capacitor electrode and the second capacitor electrode may be formed with the same material as the first scan line and the second scan line.

The display device may further include: a second thin film transistor including a second gate electrode connected to the second scan line and connected to the data line; a third thin film transistor including a third gate electrode connected to the second scan line and connecting between the first gate electrode and the first thin film transistor; a fourth thin film transistor including a fourth gate electrode connected to the first scan line and connecting between the initial power source line and the first gate electrode; a fifth thin film transistor including a fifth gate electrode connected to the light emission control line and connecting between the driving power source line and the first thin film transistor; and a sixth thin film transistor including a sixth gate electrode connected to the light emission control line and connecting between the first thin film transistor and the organic light emitting element.

The second capacitor electrode may have a larger area than the first capacitor electrode.

DETAILED DESCRIPTION

Figure 1:
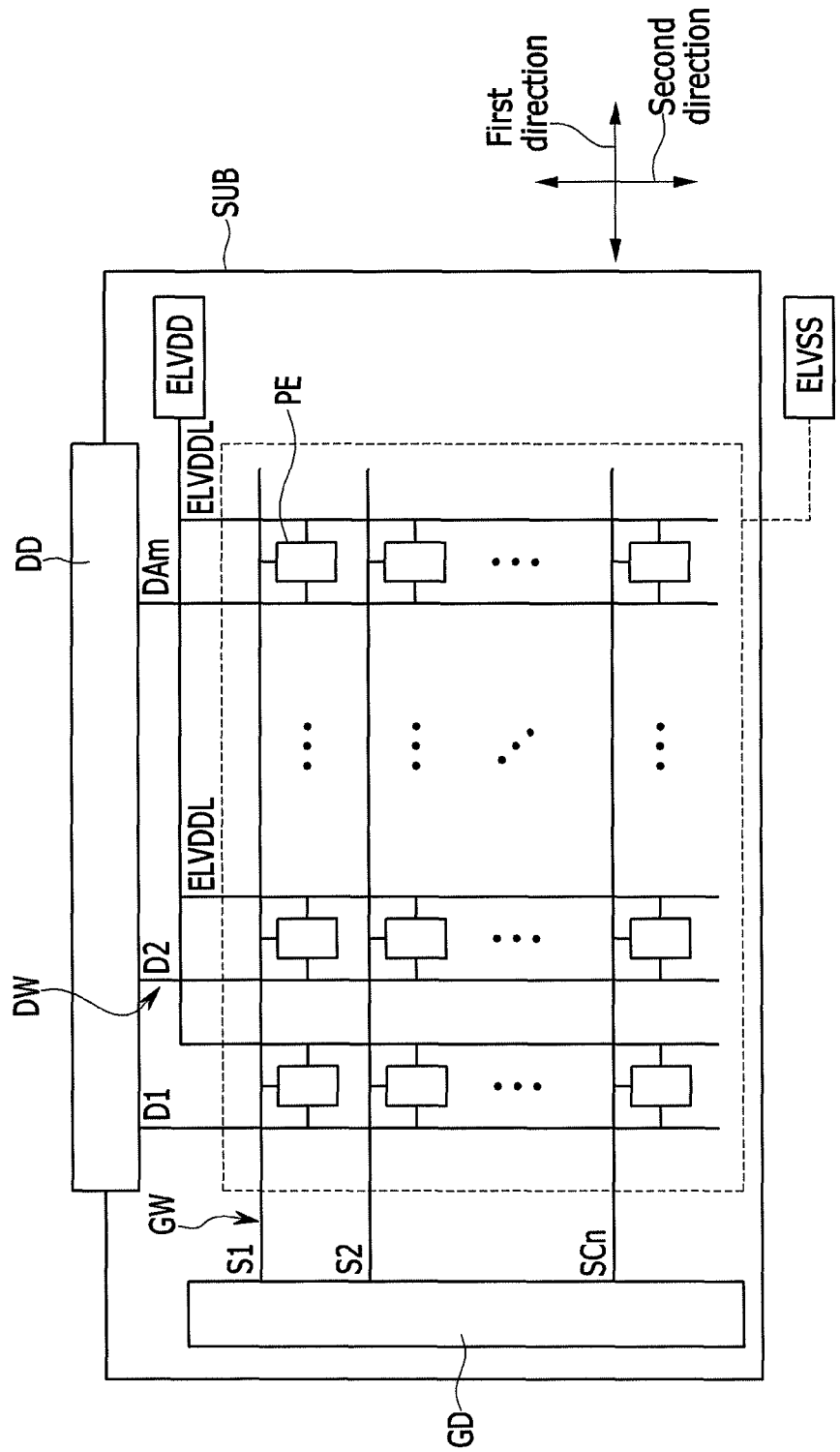
FIG. 1 is a view of a display device according to a first exemplary embodiment.

Example embodiments will be described more fully hereinafter with reference to the accompanying drawings. As those skilled in the art would realize, the described embodiments may be modified in various different ways, all without departing from the spirit or scope of the inventive concept.

The drawings and description are to be regarded as illustrative in nature and not restrictive. Like reference numerals designate like elements throughout the specification.

Further, in several exemplary embodiments, constituent elements having the same construction are assigned the same reference numerals and are representatively described in connection with a first exemplary embodiment. In the remaining exemplary embodiments, only different constituent elements from those of the first exemplary embodiment are described.

In addition, the size and thickness of each component shown in the drawings is arbitrary and shown for understanding and ease of description, but example embodiments are not limited thereto. That is, in the drawings, the thickness of layers, films, panels, regions, etc., may be exaggerated for clarity. Also, in the drawings, it will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. It will be understood that when an element such as a layer, file, region, or substrate is referred to as being "on" another element, it can be on the other element or under the other element. The element may not be on another element in a gravity direction.

Next, a display device according to the first exemplary embodiment will be described with reference to FIG. 1 to FIG. 3.

FIG. 1 is a view of a display device according to the first exemplary embodiment.

As shown in FIG. 1, a display device 1000 according to the first exemplary embodiment includes a substrate SUB, a gate driver GD, gate wires GW, a data driver DD, data wires DW, and pixels PE. Here, the pixel PE is a minimum unit displaying an image, and the display device 1000 displays the image through a plurality of pixels PE.

The substrate SUB is formed of a transparent light transmission substrate made of, e.g., glass, quartz, ceramic, or plastic. However, the first exemplary embodiment is not restricted thereto, and the substrate SUB can be formed as a metallic substrate made of, e.g., stainless steel. Further, when the substrate SUB is made of plastic, the display device 1000 can be flexible, rollable, or stretchable.

The gate driver GD sequentially supplies a scan signal to the gate wires GW corresponding to a control signal supplied by a control circuit (not shown), e.g., a timing controller. The pixel PE is selected by the scan signal to sequentially receive a data signal.

The gate wires GW are positioned on the substrate SUB and extend in the first direction. The gate wires GW include scan lines S1-SCn, which are connected to the gate driver GD to receive scan signals from the gate driver GD.

Meanwhile, in the display device 1000 according to the first exemplary embodiment, the gate wires GW include the scan lines S1-SCn, however in the display device according to another exemplary embodiment, the gate wires may further include an additional scan line, an initial power source line, and a light emission control line. In this case, the display device can be an active matrix (AM) type of OLED display with a 6Tr-2Cap structure.

The data driver DD supplies a data signal to a data line DAm from among the data wires DW corresponding to a control signal supplied by the timing controller. The data signal supplied to the data line DAm is supplied to the pixel PE selected by the scan signal when the scan signal is supplied to the scan line SCn. The pixel PE is charged with a voltage corresponding to the data signal and emits light with corresponding luminance.

The data wires DW are positioned on the gate wires GW, however they may be positioned between the gate wires GW and the substrate SUB and may extend in the second direction crossing the first direction. The data wires DW include the data lines D1-Dm and a driving power source line ELVDDL. The data lines DAm are connected to the data driver DD and receive the data signal from the data driver DD. The driving power source line ELVDDL is connected to the first power source ELVDD from the outside and receives driving power from the first power source ELVDD.

The pixel PE is positioned at a region where the gate wires GW and the data wires DW are crossed and is connected to the gate wires GW and the data wires DW. The pixel PE includes the first power source ELVDD, two thin film transistors and a capacitor connected to the gate wires GW and the data wires DW, and an organic light emitting element connected to the second power source ELVSS via the thin film transistor. The pixel PE is selected when the scan signal is supplied through the scan line SCn, it charges the voltage corresponding to the data signal through the data line DAm, and it emits light with predetermined luminance corresponding to the charged voltage. A detailed description of the pixel PE will be provided below with reference to FIG. 2.

Figure 2:
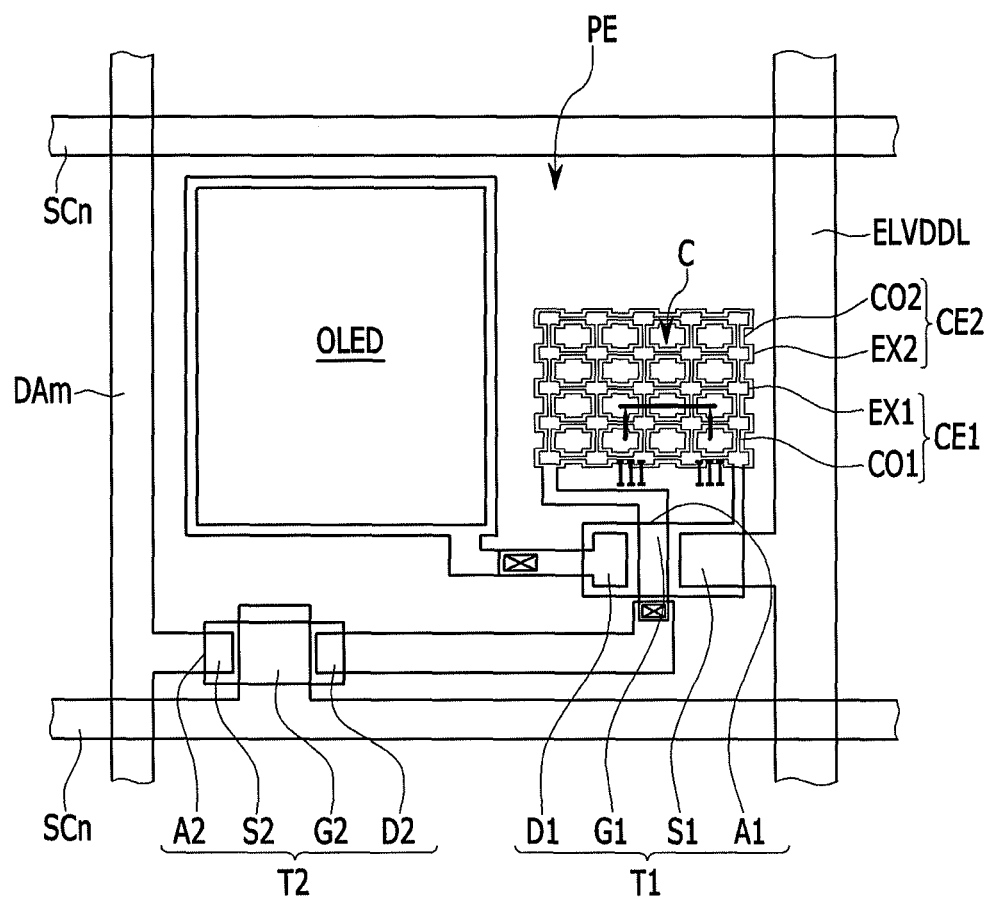
FIG. 2 is a layout view of a pixel shown in FIG. 1.

FIG. 2 shows a layout view of the pixel PE. As shown in FIG. 2, the pixel PE has a 2Tr-1Cap structure in which an OLED, two thin film transistors T1 and T2, and a capacitor C are disposed. However, in another exemplary embodiment, one pixel can have a configuration in which at least three thin film transistors and at least two capacitors are disposed.

The OLED includes a first electrode that is an anode functioning as a hole injection electrode, a second electrode that is a cathode functioning as an electron injection electrode, and an organic emission layer disposed between the first electrode and the second electrode.

In detail, in the first exemplary embodiment, the display device includes a switching thin film transistor T2, a driving thin film transistor T1, and a capacitor C formed for each pixel PE.

The switching thin film transistor T2 includes a switching gate electrode G2, a switching active layer A2, a switching source electrode S2, and a switching drain electrode D2.

The switching gate electrode G2 is connected to the scan line SCn. The switching active layer A2 is positioned corresponding to the switching gate electrode G2, and the switching source electrode S2 and the switching drain electrode D2 are respectively connected to each end thereof. The switching source electrode S2 is connected to the data line DAm. The switching drain electrode D2 is separated from the switching source electrode S2 via the switching gate electrode G2 interposed therebetween, and is connected to the second capacitor electrode CE2 of the capacitor C via a driving gate electrode G1 of the driving thin film transistor T1.

The driving thin film transistor T1 includes the driving gate electrode G1, a driving active layer A1, a driving source electrode S1, and a driving drain electrode D1.

The driving gate electrode G1 is connected to the switching drain electrode D2 of the switching thin film transistor T2 and the second capacitor electrode CE2 of the capacitor C. The driving active layer A1 is connected to the first capacitor electrode CE1 of the capacitor C. The driving source electrode S1 and the driving drain electrode D1 are separated from each other via the driving gate electrode G1 interposed therebetween, and are respectively connected to both ends of the driving active layer A1. The driving source electrode S1 is connected to the driving power source line ELVDDL, and the driving drain electrode D1 is connected to the first electrode that is an anode of the organic light emitting element.

That is, the switching source electrode S2 of the switching thin film transistor T2 is connected to the data line DAm, and the switching gate electrode G2 of the switching thin film transistor T2 is connected to the scan line SCn. Also, a node is formed between the switching drain electrode D2 of the switching thin film transistor T2 and the capacitor C such that the switching drain electrode D2 of the switching thin film transistor T2 is connected to the second capacitor electrode CE2 of the capacitor C. The switching drain electrode D2 of the switching thin film transistor T2 is connected to the driving gate electrode G1 of the driving thin film transistor T1. The driving power source line ELVDDL is connected to the driving source electrode S1 of the driving thin film transistor T1, and the first electrode that is the anode of the organic light emitting element, e.g., an OLED, is connected to the driving drain electrode D1.

Figure 3:
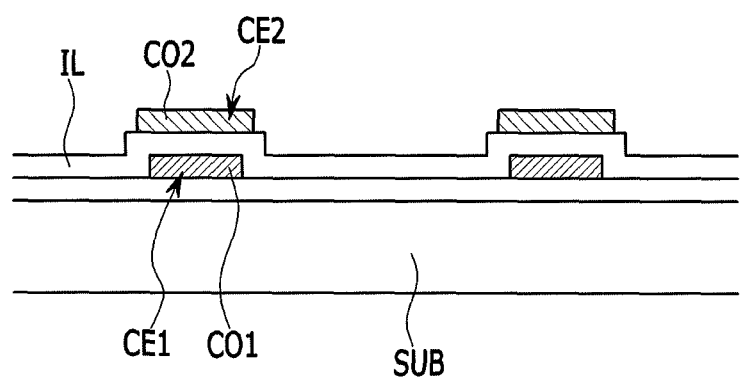
FIG. 3 is a cross-sectional view taken along line III-III of FIG. 2.

FIG. 3 is a cross-sectional view taken along the line of FIG. 2.

As shown in FIG. 2 and FIG. 3, the capacitor C is positioned on the substrate SUB and includes the first capacitor electrode CE1 and the second capacitor electrode CE2 facing each other via the insulation layer IL interposed therebetween.

The first capacitor electrode CE1 is positioned on the substrate SUB and has a planar mesh shape. The first capacitor electrode CE1 may be formed of the same material as the driving active layer A1 of the driving thin film transistor T1 and the switching active layer A2 of the switching thin film transistor T2, and may be formed, e.g., simultaneously, by a same process forming the driving active layer A1 and the switching active layer A2.

As illustrated in FIG. 2, the first capacitor electrode CE1 includes a plurality of first expansions EX1 separated from each other and a plurality of first connections CO1 connecting the neighboring first expansions EX1. For example, the first expansions EX1 may be arranged in a matrix pattern, i.e., spaced apart from each other along a first direction and a second direction perpendicular to the first direction, so a first connection COL e.g., a linear portion, may extend between every two adjacent first expansions EX1 along each of the first and second directions to connect therebetween. By connecting a plurality of the first expansions EX1 through the first connections CO1, the first capacitor electrode CE1 has the planar mesh shape. The first capacitor electrode CE1 is connected to the driving power source line ELVDDL through the driving active layer A1 and the driving source electrode S1 of the driving thin film transistor T1.

The second capacitor electrode CE2 is positioned on the first capacitor electrode CE1 via the insulation layer IL and has a planar mesh shape. The second capacitor electrode CE2 has a larger area than the first capacitor electrode CE1, such that the first capacitor electrode CE1 is completely covered by the second capacitor electrode CE2. The second capacitor electrode CE2 may be formed of the same material as the driving gate electrode G1 of the driving thin film transistor T1 and the switching gate electrode G2 of the switching thin film transistor T2, and may be formed by a same process forming the driving gate electrode G1 and the switching gate electrode G2.

The second capacitor electrode CE2 includes a plurality of second expansions EX2 respectively corresponding to the plurality of the first expansions EX1 and separated from each other, and a plurality of second connections CO2 connecting neighboring second expansions EX2. For example, the second expansions EX2 may be arranged in a matrix pattern, so a second connection CO2 may extend between every two adjacent first expansions EX1 along each of the first and second directions to connect therebetween. For example, each second expansion EX2 may have a same shape but larger area than a corresponding first expansion EX1, so edges of the second expansions EX2 may extend beyond the first expansions EX1. Similarly, each second connection CO2 may have a same form but larger area than a corresponding first connection CO1, so edges of the second connections CO2 may extend beyond the first connections CO1.

By connecting the plurality of the second expansions EX2 through the second connections CO2, the second capacitor electrode CE2 has a planar mesh shape. That is, the spaced second expansions EX2 define openings therebetween to define the mesh shape.

The second capacitor electrode CE2 is connected to the switching drain electrode D2 of the switching thin film transistor T2 through the driving gate electrode G1 of the driving thin film transistor T1.

The switching thin film transistor T2 is used as a switch for selecting the pixel PE to be emitted. If the switching thin film transistor T2 is instantly turned on, the power is supplied from the driving power source line ELVDDL to the first capacitor electrode CE1 of the capacitor C and simultaneously the power is supplied to second capacitor electrode CE2 from the data line DAm through the switching thin film transistor T2 such that the capacitor C is charged. At this time, the charged charge amount is proportional to the voltage applied from the data line DAm. In the state that the switching thin film transistor T2 is turned off, the gate potential of the driving thin film transistor T1 is increased according to the potential charged to the capacitor C. Also, the driving thin film transistor T1 is turned on if the gate potential is over the threshold voltage. Thus, the voltage applied to the driving power source line ELVDDL is applied to the organic light emitting element (OLED) through the driving thin film transistor T1 such that the organic light emitting element (OLED) emits the light.

The above-noted configuration of the pixel (PE) is not restricted to the description, and is variable in many ways within a range that is easily modifiable by a person skilled in the art.

As described above, the display device 1000 according to the first exemplary embodiment includes the first capacitor electrode CE1 and the second capacitor electrode CE2 of the capacitor C with a mesh shape, e.g., as opposed to a solid plate shape. Accordingly, only a defective portion of each of the first and second capacitor electrodes CE1 and CE2, e.g., only defective ones of the plurality of the first and second expansions EX1 and EX2 and/or defective ones of the first and second connection portions CO1 and CO2, may be removed, e.g., cut out, so the remaining non-defective portions of the electrodes may be used as the capacitor C. In other words, due to the mesh structure of the capacitor C, removal of a defective portion of the first and/or second capacitor electrodes CE1 and CE2 may not affect operation of the capacitor C, so the capacitor C may continue operation even though at least one of the first capacitor electrode CE1 and the second capacitor electrode CE2 was undesirably defective, e.g., because of particles. For example, when a defect is generated in one second expansion EX2 among a plurality of the second expansions EX2, four second connections CO2 connected to the one defective second expansion EX2 may be cut using a cutting means, e.g., a laser, to disconnected the defective second expansion EX2 from the rest of the second expansions EX2, e.g., to make the defective second expansion EX2 floating. Accordingly, the rest of the second expansions EX2, with the exception of the defective second expansion EX2, may be used as the capacitor C.

That is, although at least one of the first capacitor electrode CE1 and the second capacitor electrode CE2 forming the capacitor C is defective, the display device 1000 is provided by only repairing the defective portion. It is noted that while the display device 1000 according to the first exemplary embodiment was described as an OLED display, example embodiments may include any other display device, e.g., a LCD, including the capacitor C.

Next, a display device according to a second exemplary embodiment will be described with reference to FIG. 4 to FIG. 6. Hereinafter, only characteristic portions that are different from the first exemplary embodiment are described, and undescribed parts will be appreciated referring to the first embodiment. In the second embodiment, the same reference numerals refer to the same components according to the first embodiment, for better comprehension and ease of description.

Figure 4:
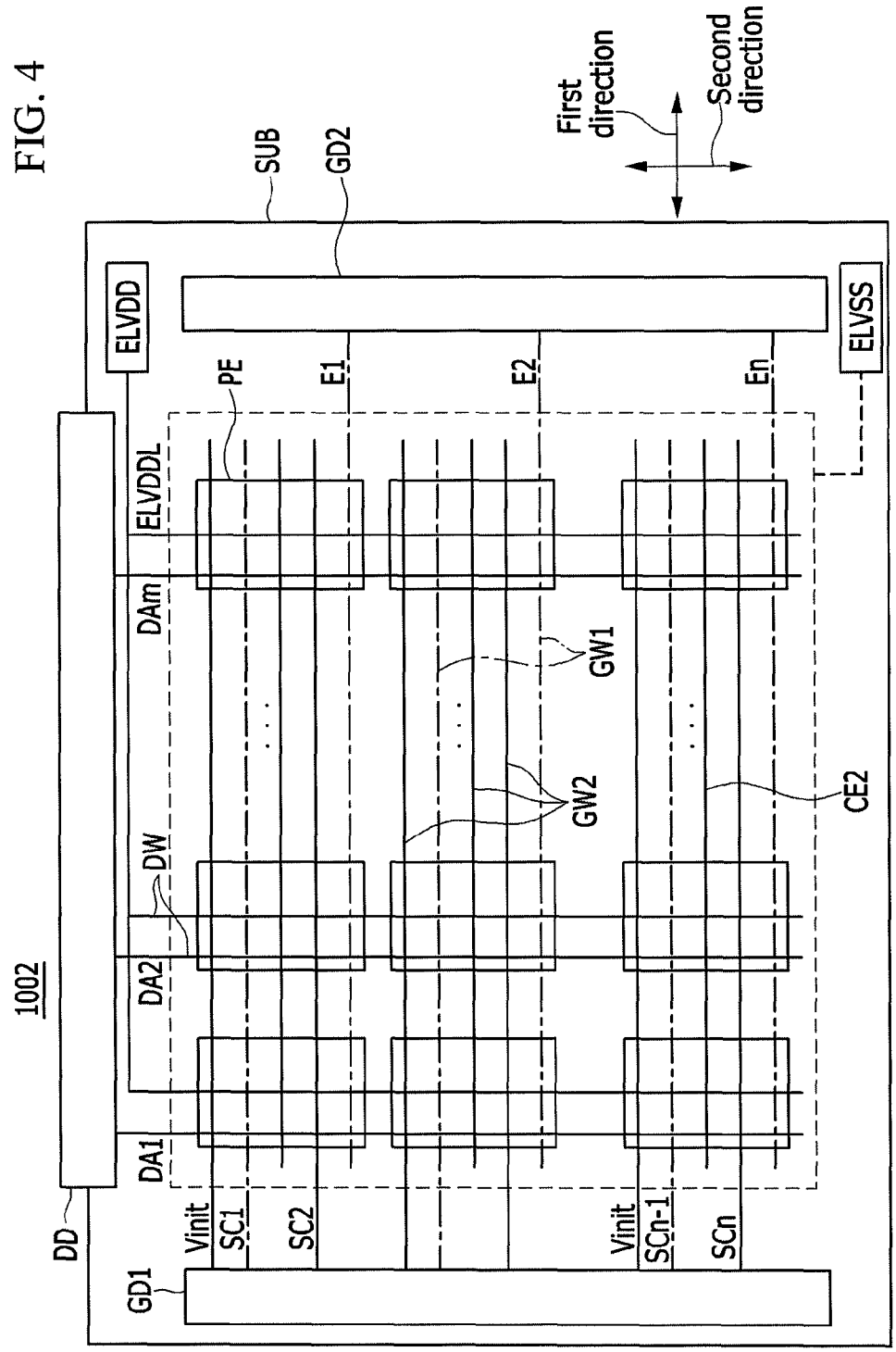
FIG. 4 is a view of a display device according to a second exemplary embodiment.

FIG. 4 is a view of a display device according to the second exemplary embodiment.

As shown in FIG. 4, a display device 1002 according to the second exemplary embodiment includes a gate driver GD1, first gate wires GW1, second gate wires GW2, a light emission control driver GD2, a data driver DD, data wires DW, and the pixels PE.

The gate driver GD1 sequentially supplies the scan signals to the first scan lines SC1-SCn-1 and the second scan lines SC2-SCn respectively included in the first gate wires GW1 and the second gate wires GW2 by corresponding to a control signal supplied from an external control circuit (not shown), e.g., a timing controller. Then, the pixels PE are selected by the scan signal and sequentially receive data signals.

The first gate wires GW1 are disposed on the substrate SUB and extended in the first direction. The first gate wires GW1 include the first scan lines SC1-SCn-1, and the light emission control lines E1-En. The first scan lines SC1-SCn-1 are connected to the gate driver GD1 and receive the scan signal from the gate driver GD1. The light emission control lines E1-En are connected to the light emission control driver GD2 and receive the light emission control signal from the light emission control driver GD2.

The second gate wires GW2 are positioned on the first gate wires GW1 and extend in the first direction. The second gate wires GW2 include the second scan lines SC2-SCn, the initial power source line Vinit, and the second capacitor electrode CE2 that will be described later.

The first gate wires GW1 and the second gate wires GW2 are non-overlapping. That is, the first gate wires GW1 and the second gate wires GW2 do not overlap.

The second scan lines SCn are connected to the gate driver GD1 and receive the scan signal from the gate driver GD1. The initial power source line Vinit is connected to the gate driver GD1 and receives the initial power source from the gate driver GD1. The second capacitor electrode CE2 is separated from the first scan line SCn and extends in the first direction.

As described above, the initial power source line Vinit, the first scan line SCn, the second capacitor electrode CE2, the second scan line SCn, and the light emission control line En are respectively separated from each other and extend in the first direction, and the first scan line SCn and the second scan line are positioned with the different layers via the insulation layer IL that will be described later regarding the substrate SUB.

In the first exemplary embodiment, the initial power source line Vinit receives the initial power from the gate driver GD1, however in another exemplary embodiment, the initial power source line Vinit is connected to the additional configuration thereby receiving the initial power from the additional configuration.

The light emission control driver GD2 sequentially supplies the light emission control signal to the light emission control line En by corresponding to the control signal supplied from the external, such as the timing controller. Thus, the light emitting of the pixel PE is controlled by the light emission control signal. That is, the light emission control signal controls the light emitting time of the pixel PE. However, the light emission control driver GD2 may be omitted according to an inner structure of the pixel PE.

The data driver DD supplies the data signal to the data line DAm among the data wires DW by corresponding with the control signal supplied from the outside, such as the timing controller. The data signal supplied to the data line DAm is supplied to the pixel PE selected by the scan signal for each supply of the scan signal to the second scan line SCn. Thus, the pixel PE charges the voltage corresponding to the data signal and emits the light with the luminance corresponding thereto.

The data wires DW are positioned on the second gate wires GW2 and extend in the second direction crossing the first direction. The data wires DW include the data lines DA1-DAm and the driving power source line ELVDDL. The data line DAm is connected to the data driver DD and receives the data signal from the data driver DD. The driving power source line ELVDDL is connected to the first power source ELVDD that will be described later from the outside and receives the driving power source from the first power source ELVDD.

The pixel PE is positioned at the region where the first gate wires GW1, the second gate wires GW2, and the data wires DW are crossed, and includes the organic light emitting element emitting the light with the luminance corresponding to the driving current corresponding to the data signal and a pixel circuit to control the driving current flowing to the organic light emitting element. The pixel circuit is respectively connected to the first gate wires GW1, the second gate wires GW2, and the data wires DW, and the organic light emitting element is connected to the pixel circuit. The organic light emitting element is connected between the first power source ELVDD and the second power source ELVSS.

Figure 5:
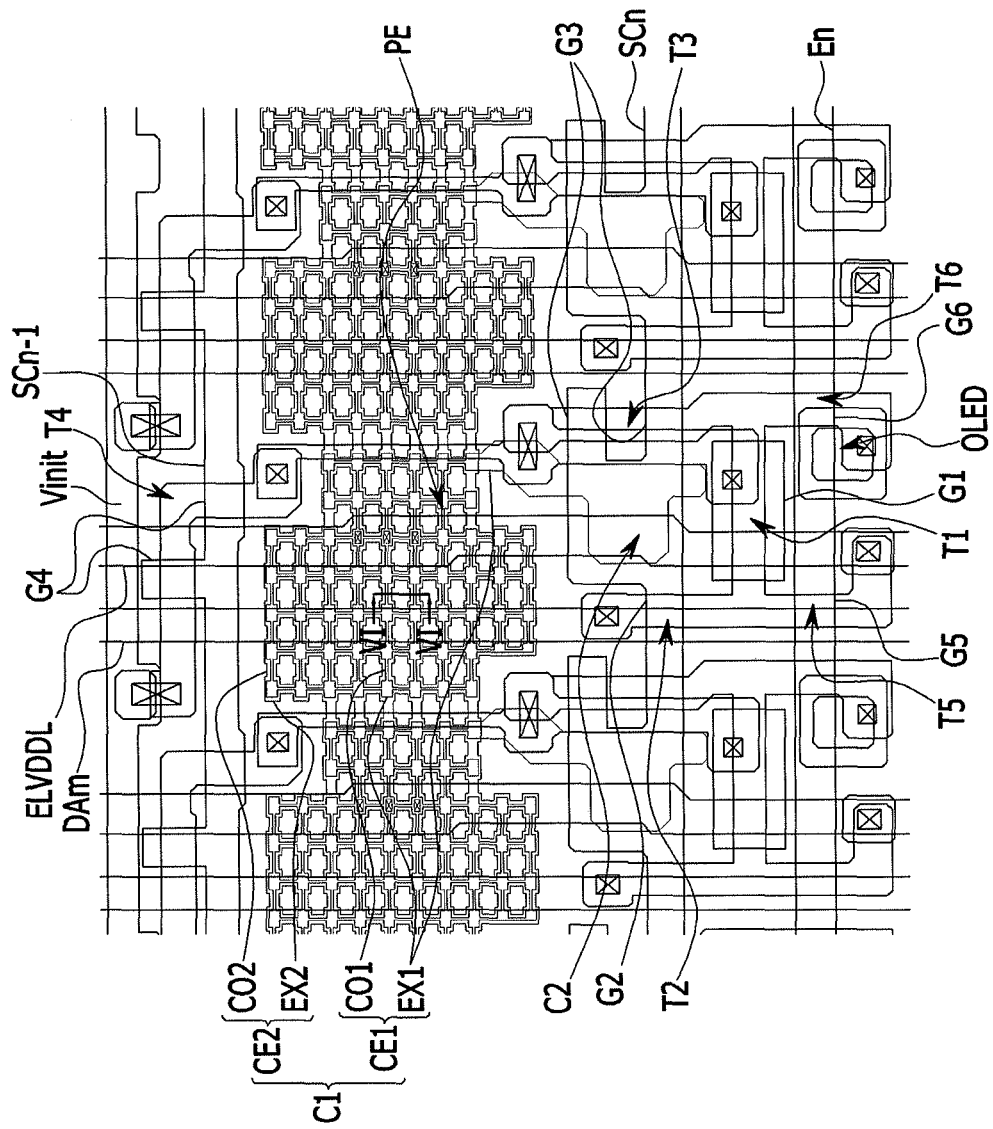
FIG. 5 is a layout view of a pixel shown in FIG. 4.

FIG. 5 is a layout view of a pixel part shown in FIG. 4. As shown in FIG. 5, the pixel PE includes the organic light emitting element (OLED) connected between the first power source ELVDD and the second power source ELVSS and the pixel circuit connected between the organic light emitting element (OLED) and the first power source ELVDD and controlling the driving power supplied to the organic light emitting element (OLED).

The anode of the organic light emitting element (OLED) is connected to the driving power source line ELVDDL connected to the first power source ELVDD through the pixel circuit, and the cathode of the organic light emitting element (OLED) is connected to the second power source ELVSS. The organic light emitting element (OLED) emits light with the luminance corresponding to the driving current flowing to the organic light emitting element (OLED) when the driving power is supplied from the first power source ELVDD through the pixel circuit and a common power is supplied from the second power source ELVSS.

The pixel circuit includes the first thin film transistor T1, the second thin film transistor T2, a third thin film transistor T3, a fourth thin film transistor T4, a fifth thin film transistor T5, a sixth thin film transistor T6, a first capacitor C1, and a second capacitor C2.

The first thin film transistor T1 is connected between the driving power source line ELVDDL and the organic light emitting element (OLED) and supplies the driving power corresponding to the data signal to the organic light emitting element (OLED) from the first power source ELVDD during the light emitting time of the pixel PE. That is, the first thin film transistor T1 functions as the driving transistor of the pixel PE. The first gate electrode G1 of the first thin film transistor T1 is respectively connected to the first capacitor electrode CE1 of the first capacitor C1 and the second capacitor C2, the source electrode is respectively connected to the second thin film transistor T2 and the fifth thin film transistor T5, and the drain electrode is respectively connected to the third thin film transistor T3 and the sixth thin film transistor T6. The organic light emitting element (OLED) is connected to the first thin film transistor T1 through the sixth thin film transistor T6.

The second thin film transistor T2 is connected between the data line DAm and the first thin film transistor T1 and includes the second gate electrode G2 connected to the second scan line SCn. The second thin film transistor T2 transmits the data signal supplied from the data line DAm inside the pixel PE when the scan signal is supplied from the second scan line SCn. That is, the second thin film transistor T2 functions as the switching transistor of the pixel PE.

The third thin film transistor T3 connects between the first thin film transistor T1 and the first gate electrode G1 and includes the third gate electrode G3 connected to the second scan line SCn. The third thin film transistor T3 diode-connects the first thin film transistor T1 when the data signal is supplied inside the pixel PE to compensate the threshold voltage of the first thin film transistor T1. That is, the third thin film transistor T3 functions as the compensation transistor of the pixel PE.

The fourth thin film transistor T4 connects between the initial power source line Vinit and the first gate electrode G1 of the first thin film transistor T1 and includes the fourth gate electrode G4 connected to the first scan line SCn. The fourth thin film transistor T4 transmits the initial power supplied from the initial power source line Vinit inside the pixel PE to initiate the first thin film transistor T1 when the scan signal is supplied from the first scan line SCn-1 during the initial period before the data programming period such that the data signal is smoothly supplied inside the pixel PE during the data programming period in which the data signal is input to the pixel PE. That is, the fourth thin film transistor T4 functions as the switching transistor of the pixel PE.

The fifth thin film transistor T5 connects between the driving power source line ELVDDL and the first thin film transistor T1 and includes the fifth gate electrode G5 connected to the light emission control line En. The fifth thin film transistor T5 disconnects the connection between the driving power source line ELVDDL connected to the first power source ELVDD and the first thin film transistor T1 during a non-light emitting period of the pixel PE, and connects between the driving power source line ELVDDL and the first thin film transistor T1 during the light emitting period of the pixel PE. That is, the fifth thin film transistor T5 functions as the switching transistor of the pixel PE.

The sixth thin film transistor T6 connects between the first thin film transistor T1 and the organic light emitting element (OLED) and includes the sixth gate electrode G6 connected to the light emission control line En. The sixth thin film transistor T6 disconnects the connection between the first thin film transistor T1 and the organic light emitting element (OLED) during the non-light emitting period of the pixel PE and connects between the first thin film transistor T1 and the organic light emitting element (OLED) during the light emitting period of the pixel PE. That is, the sixth thin film transistor T6 functions as the switching transistor of the pixel PE.

The first capacitor C1 to store the data signal supplied inside the pixel PE during the data programming period and to maintain it during one frame is connected between the driving power source line ELVDDL connected to the first power source ELVDD and the first gate electrode G1 of the first thin film transistor T1 connected to the initial power source line Vinit. That is, the first capacitor C1 functions as a storage capacitor.

Figure 6:
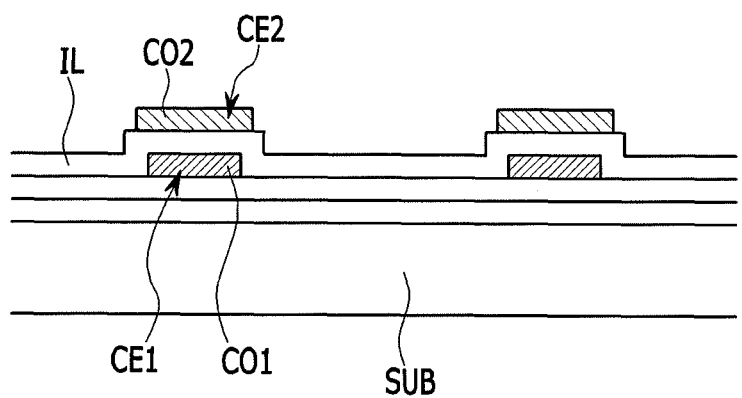
FIG. 6 is a cross-sectional view taken along line VI-VI of FIG. 5.

FIG. 6 is a cross-sectional view taken along the line VI-VI of FIG. 5. As shown in FIG. 5 and FIG. 6, the first capacitor C1 is positioned on the substrate SUB and includes the first capacitor electrode CE1 and the second capacitor electrode CE2 facing each other via the insulation layer IL interposed therebetween.

The first capacitor electrode CE1 is connected to the first gate electrode G1 of the first thin film transistor T1 connected to the initial power source line Vinit and is positioned in the same layer as the first gate wires GW1.

The first capacitor electrode CE1 is positioned on the substrate SUB and has a planar mesh shape. The first capacitor electrode CE1 is formed of the same material as the first scan line SCn of the first gate wires GW1, and may be formed by a same process forming the first gate wires GW1 and the first scan line SCn. The first capacitor electrode CE1 includes the plurality of the first expansions EX1 separated from each other and the plurality of the first connections CO1 connecting between the neighboring first expansions EX1. By connecting the plurality of the first expansions EX1 through the first connection CO1, the first capacitor electrode CE1 has the planar mesh shape. The first capacitor electrode CE1 is connected to the first gate electrode G1 of the first thin film transistor T1 through the node.

The second capacitor electrode CE2 is connected to the driving power source line ELVDDL and is positioned in the same layer as the second gate wires GW2. As shown in FIG. 4, the second capacitor electrode CE2 crosses the neighboring pixel PE and extends in the first direction.

The second capacitor electrode CE2 is positioned on the first capacitor electrode CE1 with the insulation layer IL therebetween and has the planar mesh shape. The second capacitor electrode CE2 has a larger area than the first capacitor electrode CE1, such that the first capacitor electrode CE1 is covered by the second capacitor electrode CE2. The second capacitor electrode CE2 is formed of the same material as the second scan line SCn of the second gate wires GW2 and may be formed by a same process forming the second gate wires GW2. The second capacitor electrode CE2 includes the plurality of the second expansions EX2 respectively corresponding to the plurality of the first expansions EX1 and separated from each other, and the plurality of the second connections CO2 connecting between the neighboring second expansions EX2. By connecting the plurality of the second expansions EX2 by the second connection CO2, the second capacitor electrode CE2 has the planar mesh shape. The second capacitor electrode CE2 is connected to the driving power source line ELVDDL and crosses the neighboring pixels PE to extend in the first direction, so the second capacitor electrodes CE2 of the plurality of pixels PE disposed in the first direction are mutually connected to each other and to each driving power source line ELVDDL that crosses each pixel PE in the second direction.

The second capacitor C2 compensates for the voltage drop due to the load in the display device 1002, and is connected between the first capacitor electrode CE1 of the first capacitor C1 and the second scan line SCn. That is, the second capacitor C2 increases the voltage of the first gate electrode G1 of the first thin film transistor T1 by the coupling when the voltage level of the current scan signal is changed, particularly at a time that the supply of the current scan signal is stopped, thereby functioning as a boosting capacitor compensating for the voltage drop due to the load in the display device 1002.

Next, an operation of the pixel PE will be described.

Firstly, a previous scan signal of a low level is supplied through the first scan line SCn-1 during the first period that is determined as an initial period. Thus, the fourth thin film transistor T4 is turned on by corresponding to the previous scan signal of the low level, and the initial power is supplied to the first thin film transistor T1 from the initial power source line Vinit through the fourth thin film transistor T4 to initiate the first thin film transistor T1.

Next, a current scan signal of a low level is supplied through the second scan line SCn during the second period that is determined as the data programming period. Thus, the second thin film transistor T2 and the third thin film transistor T3 are turned on by corresponding to the current scan signal of the low level.

Also, the first thin film transistor T1 is also turned on when diode-connected by the third thin film transistor T3, particularly the first thin film transistor T1 is initialized during the first period such that the first thin film transistor T1 is diode-connected in a forward direction.

Accordingly, the data signal supplied from the data line Dam is passed through the second thin film transistor T2, the first thin film transistor T1, and the third thin film transistor T3, and thereby the first capacitor C1 stores a voltage corresponding to a difference between the data signal and the threshold voltage of the first thin film transistor T1.

Next, if the voltage level of the current scan signal is changed into a high level, while the supply of the current scan signal is stopped, the voltage applied to the first gate electrode G1 of the first thin film transistor T1 is changed in accordance with a voltage change width of the current scan signal by the coupling of the second capacitor C2. At this time, the voltage applied to the first gate electrode G1 of the first thin film transistor T1 is changed by charge sharing between the first capacitor C1 and the second capacitor C2, such that the change amount applied to the first gate electrode G1 is changed in proportion to the charge sharing value between the first capacitor C1 and the second capacitor C2 as well as the voltage change width of the current scan signal.

Next, a light emission control signal supplied from the light emission control line En during the third period, that is determined as the light emitting period, is changed from the high level to the low level. Thus, the fifth thin film transistor T5 and the sixth thin film transistor T6 are turned on by the light emission control signal of the low level during the third period. Accordingly, the driving current flows into a path of the second power source ELVSS from the first power source ELVDD through the driving power source line ELVDDL while passing through the fifth thin film transistor T5, the first thin film transistor T1, the sixth thin film transistor T6, and the organic light emitting element (OLED).

This driving current is controlled by the first thin film transistor T1, and the first thin film transistor T1 generates the driving current of a magnitude corresponding to the voltage supplied to the first gate electrode G1. At this time, the voltage reflected by the threshold voltage of the first thin film transistor T1 is stored in the first capacitor C1 during the second period, such that the threshold voltage of the first transistor T1 is compensated during the third period.

As described above, the display device 1002 according to the second exemplary embodiment has the first capacitor electrode CE1 and the second capacitor electrode CE2 of the first capacitor C1 with the mesh shape without the plate shape, and when at least one of the first capacitor electrode CE1 and the second capacitor electrode CE2 is defective, e.g., because of the undesired particles, only the portion of the first expansions EX1, the second expansions EX2, the first connections CO1, and/or the second connections CO2 is cut, so the remaining portion thereof may be used as the first capacitor C1. For example, when one second expansion EX2 among a plurality of the second expansions EX2 is defective, cutting four second connections CO2 connected to the one defective second expansion EX2 via a cutting means, e.g., a laser, may render the defective second expansion floating, thereby enabling the remaining second expansions EX2 perform as the first capacitor C1.

Also, in the display device 1002 according to the second exemplary embodiment, the second capacitor electrode CE2 crosses the neighboring pixel PE and extends in the first direction, such that the second capacitor electrodes CE2 of the plurality of pixels PE in the first direction are mutually connected. Although the second capacitor electrode CE2 crosses the neighboring pixel PE and extends in the first direction, the second capacitor electrode CE2 has a mesh shape, rather than a solid plate shape. Therefore, when the second capacitor electrode CE2 is defective because of undesired particles, the defective portion may be cut and the rest may be used as the first capacitor C1. In contrast, when a conventional plate-shaped capacitor electrode connects the plurality of pixels while including a defective portion, all the connected pixels may malfunction.

For example, when one second expansion EX2 among the plurality of the second expansions EX2 is defective, by cutting four second connections CO2 connected to one defective second expansion EX2 by using the cutting means such as the laser, the repair process of floating the defective second expansion EX2 from a plurality of the remaining second expansions EX2 is performed such that a plurality of the remaining second expansions EX2 except for the second expansion EX2 may be used as the first capacitor C1. That is, only repairing (or removing) the defective portion in a capacitor electrode of the display device 1002 may be provided, while the remaining portion of the capacitor electrode may continue operation of the capacitor.

According to an exemplary embodiment, although the capacitor electrode forming the capacitor includes a defective portion, the display device may continue operation by removing only the defective portion of the capacitor due to a mesh structure of the electrodes of the capacitor. In contrast, the conventional OLED display includes solid plate-shaped first and second capacitor electrodes, so when only one of the first capacitor electrode and the second capacitor electrode is defective because of undesired particles, the entire capacitor may deemed defective and require replacement.

What is claimed is:

1. A display device, comprising:
   a substrate; and
   a capacitor positioned on the substrate, the capacitor including a first capacitor electrode having a mesh shape and a second capacitor electrode having a mesh shape, the second capacitor electrode being positioned on the first capacitor with an insulation layer therebetween.

2. The display device of claim 1, wherein the first capacitor electrode includes:
   a plurality of first expansions separated from each other; and
   a plurality of first connections connecting neighboring first expansions.

3. The display device of claim 2, wherein the second capacitor electrode includes:
   a plurality of second expansions separated from each other and corresponding to the plurality of the first expansions; and
   a plurality of second connections connecting neighboring second expansions.

4. The display device of claim 1, further comprising:
   a driving thin film transistor including a driving active layer connected to the first capacitor electrode, a driving gate electrode connected to the second capacitor electrode, and a driving source electrode and a driving drain electrode separated from each other via the driving gate electrode and respectively connected to the driving active layer; and
   an organic light emitting element connected to the driving drain electrode.

5. The display device of claim 4, wherein:
   the first capacitor electrode includes a same material as the driving active layer, and
   the second capacitor electrode includes a same material as the driving gate electrode.

6. The display device of claim 4, further comprising:
   a scan line extending in a first direction;
   a data line extending in a second direction crossing the first direction;
   a switching thin film transistor including a switching source electrode connected to the data line, a switching gate electrode connected to the scan line, a switching active layer positioned to correspond to the switching gate electrode and connected to the switching source electrode, and a switching drain electrode separated from the switching source electrode via the switching gate electrode and connected to the second capacitor electrode; and
   a driving power source line connected to the driving source electrode and the second capacitor electrode and extending in the second direction.

7. The display device of claim 1, further comprising:
   a first thin film transistor including a first gate electrode connected to the first capacitor electrode; and
   an organic light emitting element connected to the first thin film transistor.

8. The display device of claim 7, further comprising:
   an initial power source line extending in a first direction;
   a first scan line separated from the initial power source line and extending in the first direction;
   the second capacitor electrode separated from the first scan line and extending in the first direction;
   a second scan line separated from the second capacitor electrode and extending in the first direction;
   a light emission control line separated from the second scan line and extending in the first direction;
   a data line extending in a second direction crossing the first direction; and
   a driving power source line separated from the data line, extending in the second direction, and connected to the second capacitor electrode.

9. The display device of claim 8, wherein:
   the first scan line and the second scan line are positioned in different layers and having an insulation layer therebetween on the substrate, and
   the first capacitor electrode and the second capacitor electrode include a same material as the first scan line and the second scan line.

10. The display device of claim 8, further comprising:
    a second thin film transistor including a second gate electrode connected to the second scan line and the data line;
    a third thin film transistor including a third gate electrode connected to the second scan line and connecting between the first gate electrode and the first thin film transistor;
    a fourth thin film transistor including a fourth gate electrode connected to the first scan line and connecting between the initial power source line and the first gate electrode;
    a fifth thin film transistor including a fifth gate electrode connected to the light emission control line and connecting between the driving power source line and the first thin film transistor; and
    a sixth thin film transistor including a sixth gate electrode connected to the light emission control line and connecting between the first thin film transistor and the organic light emitting element.

11. The display device of claim 1, wherein the second capacitor electrode has a larger area than the first capacitor electrode.

* * * * *